(12) United States Patent
Sung

(10) Patent No.: US 6,281,728 B1
(45) Date of Patent: Aug. 28, 2001

(54) DELAY LOCKED LOOP CIRCUIT

(75) Inventor: Jun Bae Sung, Kyoungki-do (KR)

(73) Assignee: Hyundai Electronics Industries, Co., Ltd (KR)

( * ) Notice: Subject to any disclaimer, the term of this patent is extended or adjusted under 35 U.S.C. 154(b) by 0 days.

(21) Appl. No.: 09/545,643

(22) Filed: Apr. 7, 2000

(30) Foreign Application Priority Data

Apr. 9, 1999 (KR) .................................................. 99-12454

(51) Int. Cl.[7] ...................................................... H03L 7/06
(52) U.S. Cl. ........................... 327/158; 327/161; 327/159
(58) Field of Search .................................. 327/149, 150, 327/153, 158, 159, 161; 331/1 A, 17, 25; 375/376

(56) References Cited

U.S. PATENT DOCUMENTS 5,990,714 * 11/1999 Takahashi ............................ 327/149
6,198,690 * 3/2001 Kato et al. ............................ 365/233

* cited by examiner

Primary Examiner—Terry D. Cunningham
Assistant Examiner—Quan Tra
(74) Attorney, Agent, or Firm—Pillsbury Winthrop LLP

(57) ABSTRACT

A delay locked loop circuit, comprising: first delay means for receiving an external clock signal to generate a delay clock signal; first oscillation means for generating a first pulse signal; second oscillation means for generating a second pulse signal; phase detection means for receiving the external clock signal and an internal clock signal and generating a phase detection signal; second delay means for delaying the delay clock signal by one period of the first pulse signal of the first oscillation means to generate a first plurality of clock signals; third delay means for delaying the delay clock signal by one period of the second pulse signal of the second oscillation means to generate a second plurality of clock signals; selection means for selecting a pair of clock signals having the same delay time from the first plurality of clock signals and the second plurality of clock signals; logic means for combining the pair of clock signals selected from the selection means to generate the internal clock signal; and control means for generating control signals for controlling the first delay means, the first and second oscillation means and the selection means and a reset signal for resetting the first and second delay means in accordance with the phase detection signal from the detection means.

7 Claims, 7 Drawing Sheets

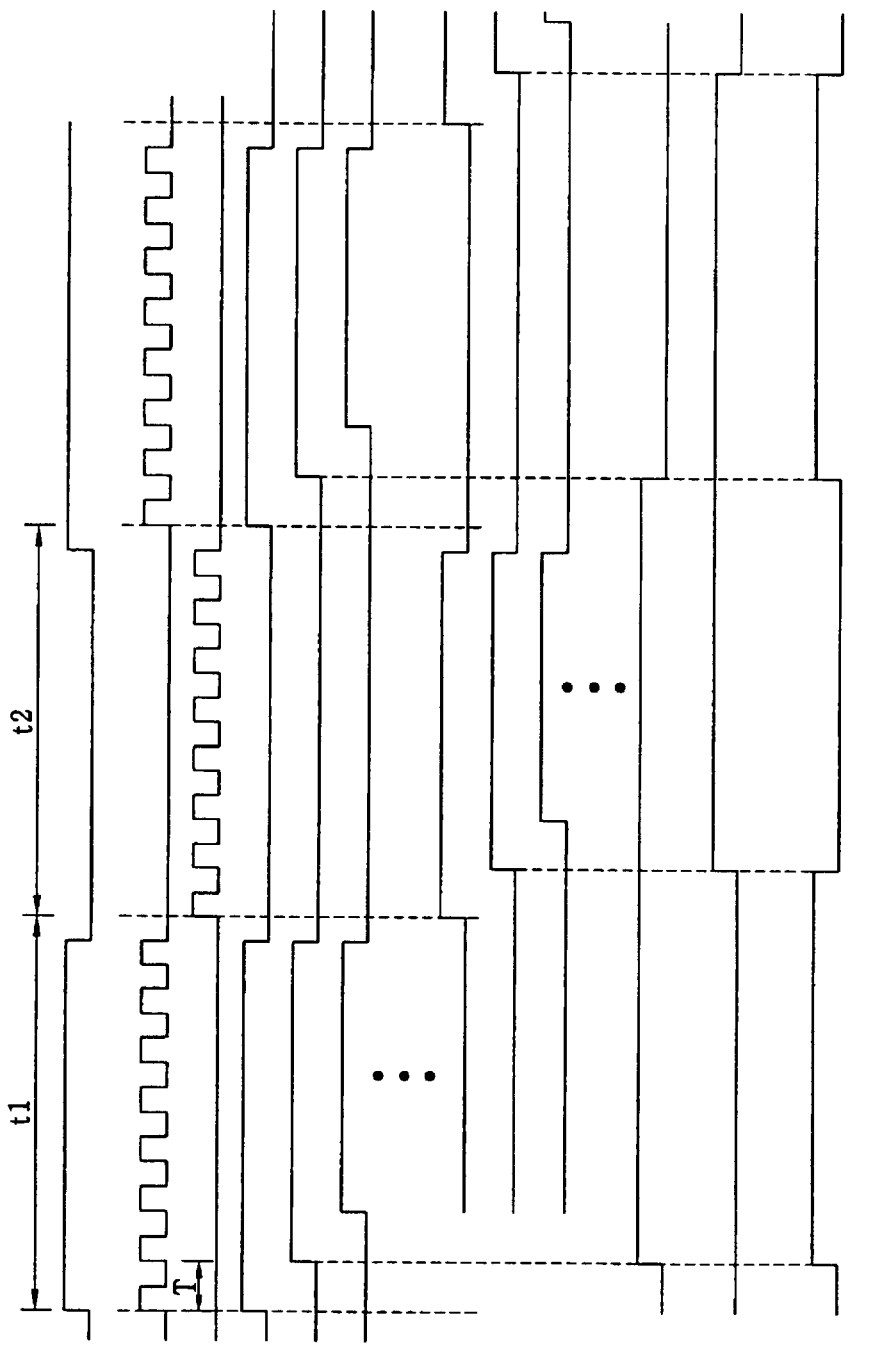

DELAY LOCKED LOOP CIRCUIT

BACKGROUND OF THE INVENTION

This invention relates to a semiconductor memory device, and more particularly to a delay locked loop circuit with wide operation range and improved locking time and performance.

In general, high speed semiconductor memory devices such as Rambus DRAM, synchronous DRAM, synchlink DRAM and double data rate (DDR) DRAM generate internal clock signals which are used in their internal circuits by using an external clock signal. However, the phase difference between the external clock signal and the internal clock signal is made due to physical delay. The prior semiconductor memory device uses the delay locked loop circuit which remove the phase difference between the internal clock signal and the external clock signal to solve the problem of set-up time and hold time.

FIG. 1A shows a block diagram of the delay locked loop circuit of a DDR DRAM. The delay locked loop circuit includes: a plurality of delay circuits 10 of delay chain which delay an input signal IN for a selected time and providing it to the next delay circuit; and a shift register 12 for generating select signals for respectively selecting any one of the delay circuits to the delay circuits.

FIG. 1B shows a circuit diagram of the delay circuit of FIG. 1A. The delay circuit includes: a NAND gate NAND1 for receiving the input signal Input and the corresponding selection signal sel; a NAND gate NAND2 for receiving a power supply voltage Vcc and an output signal of the NAND gate NAND1; and an inverter IV1 for inverting an output signal of the NAND gate NAND2 to provide it to the next delay circuit.

In the delay locked loop circuit, the input signal Input is provided to one of delay circuits which is selected by the selection signal sel of the shift register 12 and delayed. The delayed input signal delayed through the selected delay circuit is passing through the next delay circuits and finally the internal clock signal is generated through the last delay circuit. Accordingly, when the last one of the delay circuits 10 is selected by the shift register 12, the delay time through the delay locked loop circuit becomes minimum value. On the other hand, when all the delay circuits 10 are selected by the shift resister 20, the delay time through the delay locked loop circuit becomes maximum value.

FIG. 1C is a graph showing the delay line characteristic of the prior delay locked loop circuit in FIG. 1A. The delay line characteristic is obtained in case where the delay locked loop circuit is constituted with the 128 delay circuits. As illustrated in the graph, the delay locked loop circuit having 128 delay chains has the superior linearity of the delay line.

However, so as to obtain the wider operation range than the prior delay locked loop circuit of FIG. 1A, the delay chains far more than 128 are necessary so that lay out is limited. Besides, although the minimum delay chains are used to increase accuracy of a synchronous signal, at least one delay circuit should be used in the delay locked loop circuit so that it is limited to embody the high performance delay locked loop circuit.

FIG. 2A shows a circuit diagram of a delay locked loop circuit in a synclink DRAM. The delay locked loop circuit includes a plurality of delay circuit 20 of delay chain; a multiplexer 22 for receiving output signals of the delay circuits 20 and selecting one of the output signals.

FIG. 2B shows a circuit diagram of the delay circuit in FIG. 2A. The delay circuit 20 is constituted with a differential amplifier. If a control signal Ctrlp is at logic low level and a control signal Ctrln is at logic high level, a power supply voltage Vcc is applied through transfer gates TM1 and TM2 and a current pass is formed to a ground terminal Vss through a NMOS transistor N3. Therefore, the delay circuit 20 operates.

At this time, if the input signals INp and INn are applied to gates of NMOS transistors N1 and N2, the delay circuit 20 outputs the differential amplified-signal through output terminals OUTn and OUTp by the voltage difference between the input signals INn and Inp.

FIG. 2C is a graph showing the delay line characteristic of the prior delay locked loop circuit in FIG. 2A. In the prior delay locked loop circuit, total delay time due to delay line is adjusted to one period(T cycles) of an input clock. If the delay circuit 20 is constituted with 32 delay chains, the multiplxer 22 selects any one of 32 reference clocks.

However, because the delay circuit 20 is designed under the consideration of minimum period and maximum period, the delay locked loop circuit having plural delay chains has a limit in design rule.

Besides, in case where the delay locked loop circuit uses 6-bit digital to analog converter (DAC), if the operation range (maximum delay time minus minimum delay time) is 10 ns, then the delay time per one step becomes 10 ns/64step=156.25 ps.

However, the delay time per one step of the 6-bit DAC in the area of inferior linearity, that is, in the minimum delay area has a difference ten times more than the delay time per one step in the maximum delay area. This phenomenon is understood from the tangent line of the characteristic graph of delay line in FIG. 2B.

Accordingly, if the operation range of the prior delay locked loop circuit of FIG. 2A becomes very narrower, it maintains very superior linearity. On the contrary, if the operation range of the prior delay locked loop circuit becomes wider, linearity becomes deteriorated so that the efficiency is degraded.

FIG. 3A shows a circuit diagram of a delayed locked loop circuit in a Rambus DRAM. The delay locked loop circuit includes four delay circuits 30 operating at ½ period of an input clock; a multiplexer 32 selecting two signals of the respective two output signals from the 4 delay circuits; and a phase mixer 34 for selecting one of two signals from the multiplexer 32 and providing the selected one as a final clock signal.

FIG. 3B shows a circuit diagram of the delay circuit in FIG. 3A. The delay circuit 30 includes a phase mixer 34 for receiving a clock input signal Input and a delayed clock input signal through two amplifiers 35 and for providing a mixed signal of the clock input signal Input and delayed input signal. The phase mixer 34 outputs the mixed signal of two input signals with a differential current control.

As shown in FIG. 3C, if the maximum current is Ifast and the minimum current is Islow, the delay circuit 30 outputs the input clock signal Input as an output clock signal which is directly provided to the phase mixer 34 without delay through the amplifiers 35. On the other hand, if the maximum current is Islow and the minimum current is Ifast, the delay circuit 30 outputs the input clock signal delayed through the amplifiers 35. If the currents Ifast and Islow have the same value, the delay circuit 30 outputs a clock signal which has the intermediate phase between the non-delayed input clock signal and the delayed input cock signal through the amplifiers 35.

Herein, the differential control current is adjusted by a 8-bit DAC. If the operation range is divided into 256 steps, an amount of delay per one step can be obtained. Accordingly, if the operation range becomes wider, the delay time per step becomes larger so that the performance in design can not obtained.

Besides, because the operation range of the delay circuit 30 in FIG. 3B is determined by the capacitors C1 and C2 and the amplifiers 35, there is a limit to design the delay circuit which operates at a slow rate.

SUMMARY OF THE INVENTION

It is an object of the present invention to provide a delay locked loop circuit of a semiconductor memory device with wide operation range and improved locking time and performance, by supplementing the digital delay device to the conventional analog delay device.

It is an aspect of the present invention to provide a delay locked loop circuit, comprising: first delay means for receiving an external clock signal to generate a delay clock signal delayed for a selected time; first oscillation means for generating a first pulse signal having a constant period in the first logic level interval of the delay clock signal from the first delay means; second oscillation means for generating a second pulse signal having the same period as the first pulse signal in the second logic level interval of the delay clock signal from the first delay means; phase detection means for receiving the external clock signal and an internal clock signal and generating a phase detection signal between two clock signals; second delay means for successively delaying the delay clock signal by one period of the first pulse signal of the first oscillation means to generate a first plurality of clock signals in the first logic level interval of the delay clock signal, each of the first plurality of clock signals having two times period of the delay clock signal; third delay means for successively delaying the delay clock signal by one period of the second pulse signal of the second oscillation means to generate a second plurality of clock signals in the second level interval of the delay clock signal, each of the second plurality of clock signals having two times period of the delay clock signal; selection means for selecting a pair of clock signals having the same delay time from the first plurality of clock signals and the second plurality of clock signals; logic means for combining the pair of clock signals selected from the selection means to generate the internal clock signal, the internal clock signal having the same period of the external clock signal and the internal clock signal being a delayed clock signal of the external clock signal by a selected period of the first pulse signal; and control means for generating control signals for controlling the first delay means, the first and second oscillation means and the selection means and a reset signal for resetting the first and second delay means in accordance with the phase detection signal from the detection means.

According to the delay locked loop circuit in accordance with an embodiment of this invention, the first logic level interval is logic high level interval of the delay clock signal and the second logic level interval is logic low level interval of the delay clock signal.

According to the delay locked loop circuit in accordance with an embodiment of this invention, the second delay means includes: D-flip flops being activated for a first logic level interval of the delay clock signal from the first delay means and for generating clock signals in the first logic level interval of the delay clock signal from the first delay means which successively delayed by one period of the first pulse signal from the first oscillation means from the first logic level of the delay clock signal from the first delay means; and T-flip flops reset by the reset signal from the control means and for generating the first plurality of clock signals which have two times period of the clock signals from the D-flip flops and are successively delayed by one period of the first pulse signal from the first oscillation means.

According to the delay locked loop circuit in accordance with an embodiment of this invention, the third delay means includes: D-flip flops D-FF being activated for the second logic level interval of the delay clock signal from the first delay means and for generating clock signals in the second logic level interval of the delay clock signal from the first delay means which successively delayed by one period of the second pulse signal from the second oscillation means from the second logic level of the delay clock signal from the first delay means; and T-flip flops reset by the reset signal from the control means and for generating the second plurality of clock signals which have two times period of the clock signals from the D-flip flops and are successively delayed by one period of the second pulse signal from the second oscillation means.

According to the delay locked loop circuit in accordance with an embodiment of this invention, the selection means and the logic means are comprised of a multiplexer and an exclusive OR gate, respectively and the first and second oscillation means are comprised of voltage controlled oscillators.

BRIEF DESCRIPTION OF DRAWINGS

FIG. 5A to FIG. 5L are timing diagrams of the delay locked loop circuit in FIG. 4.

DETAILED DESCRIPTION OF THE INVENTION

Figure 1A:
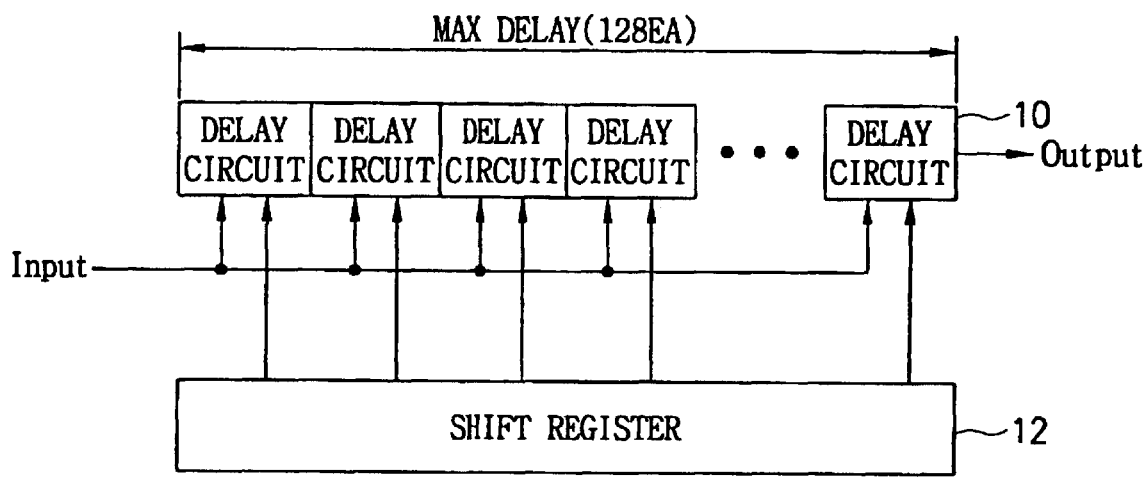
FIG. 1A is a block diagram of a delay locked loop circuit of a DDR DRAM in the prior art.
Figure 1B:
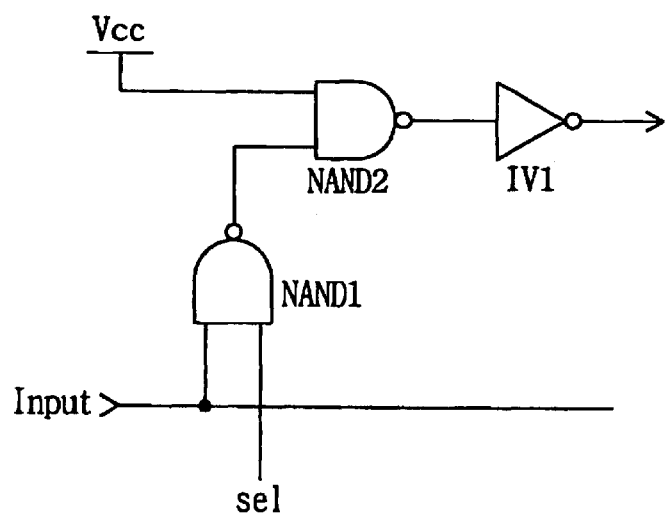
FIG. 1B is a circuit diagram of a delay circuit of the delay locked loop circuit of FIG. 1A.
Figure 1C:
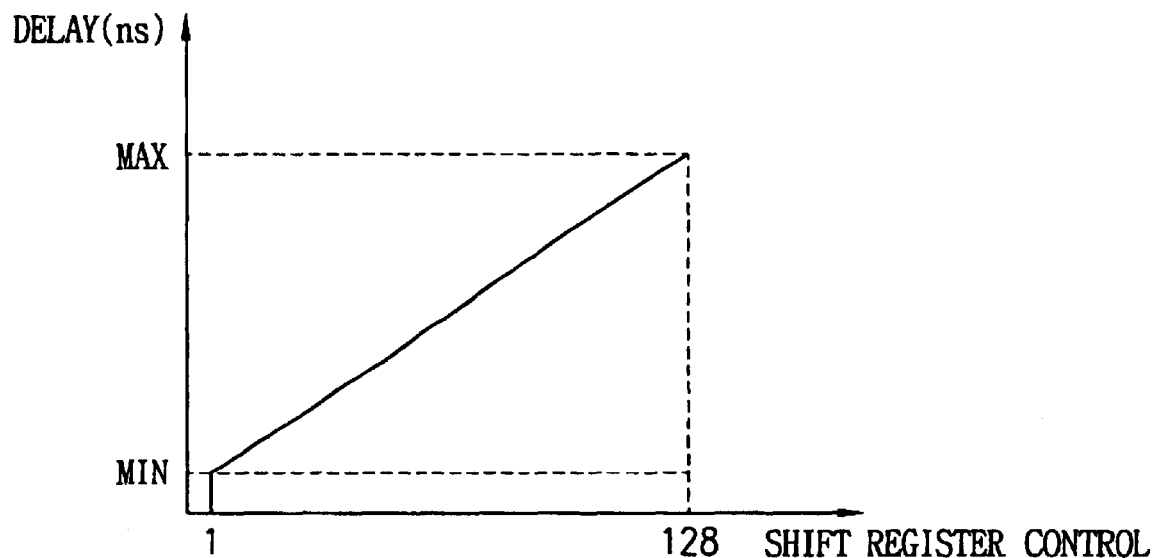
FIG. 1C is a graph showing characteristic of a delay line in the delay locked loop circuit of FIG. 1A.
Figure 2A:
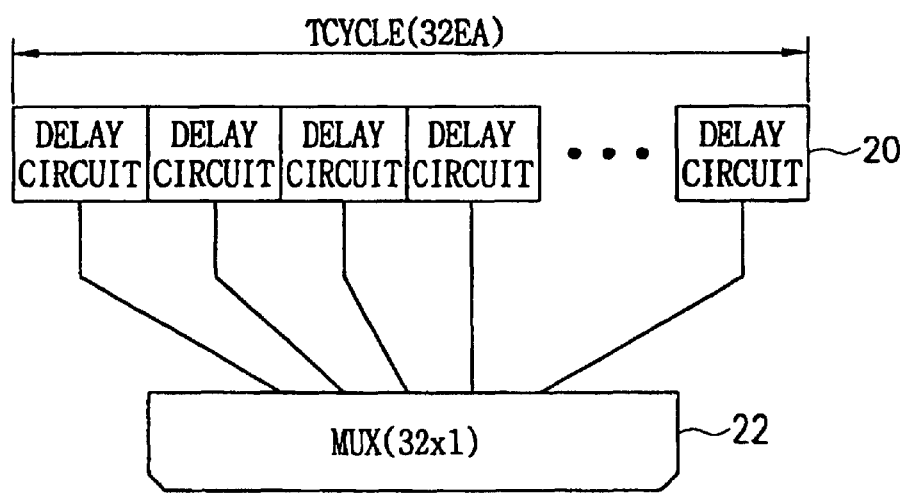
FIG. 2A is a block diagram of a delay locked loop circuit of a synclink DRAM.
Figure 2B:
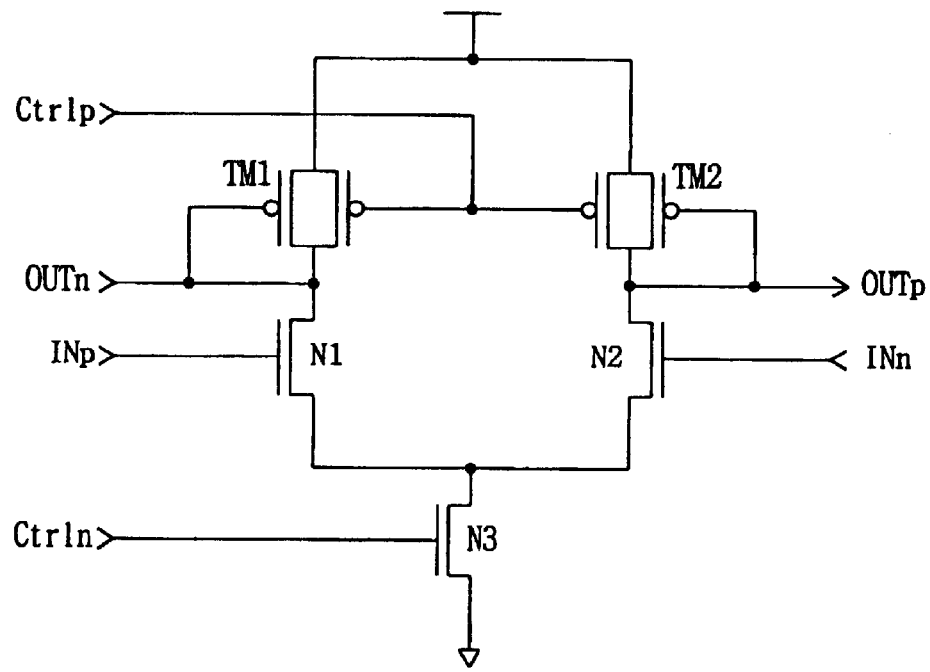
FIG. 2B is a circuit diagram of a delay circuit of the delay locked loop circuit in FIG. 2A in the prior art.
Figure 2C:
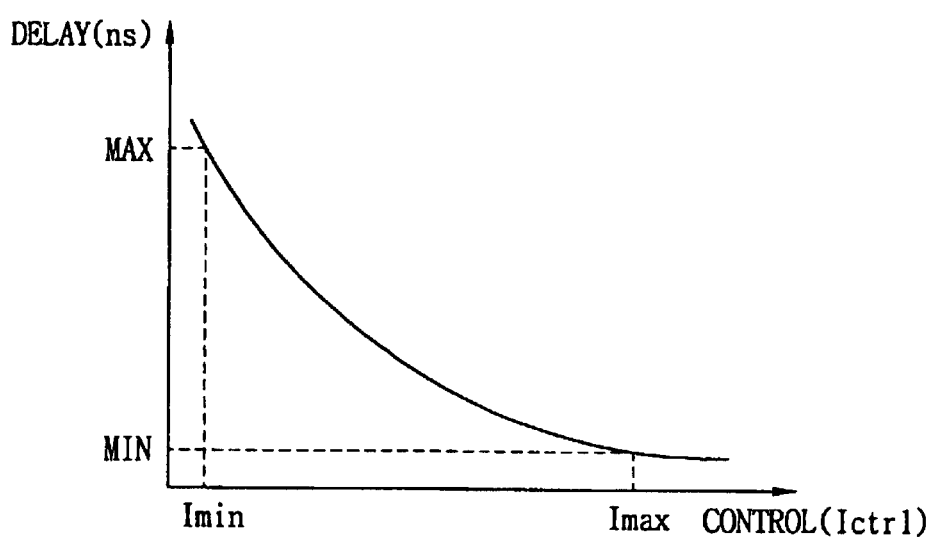
FIG. 2C is a graph showing characteristic of a delay line in the delay locked loop circuit in FIG. 2B.
Figure 3A:
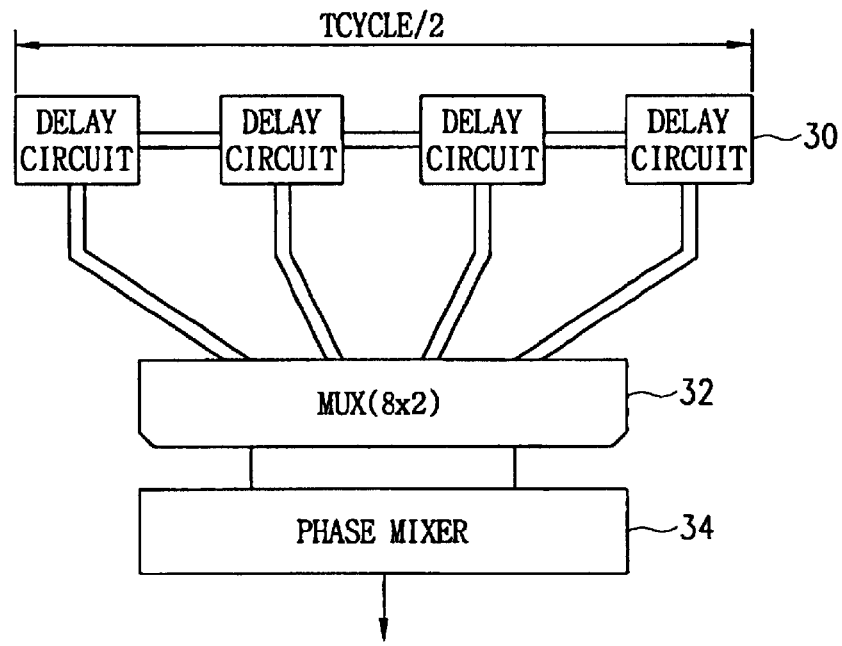
FIG. 3A is a block diagram of a delay locked loop circuit of a Rambus DRAM.
Figure 3B:
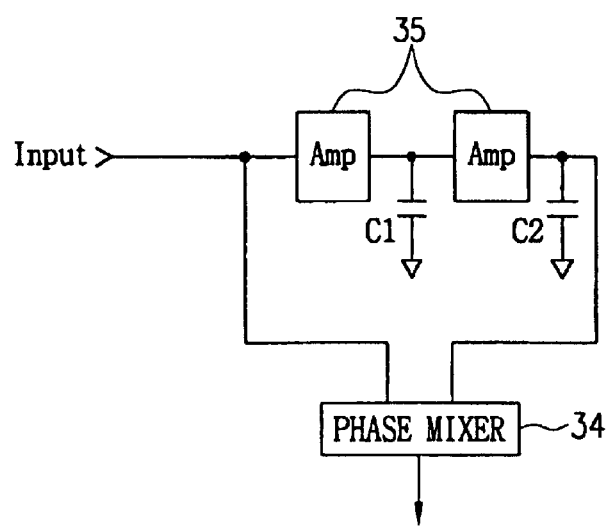
FIG. 3B is a circuit diagram of a delay circuit and a phase mixer of the delay locked loop circuit in FIG. 3A.
Figure 3C:
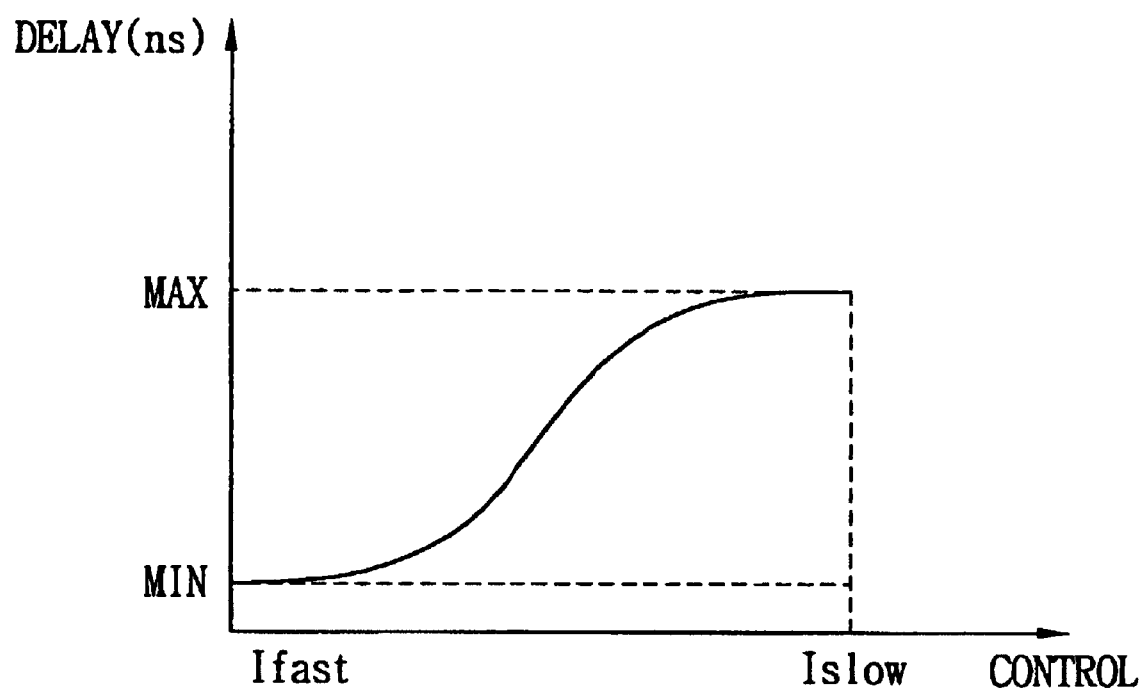
FIG. 3C is a graph showing characteristic of the delay locked loop circuit of FIG. 3A.
Figure 4:
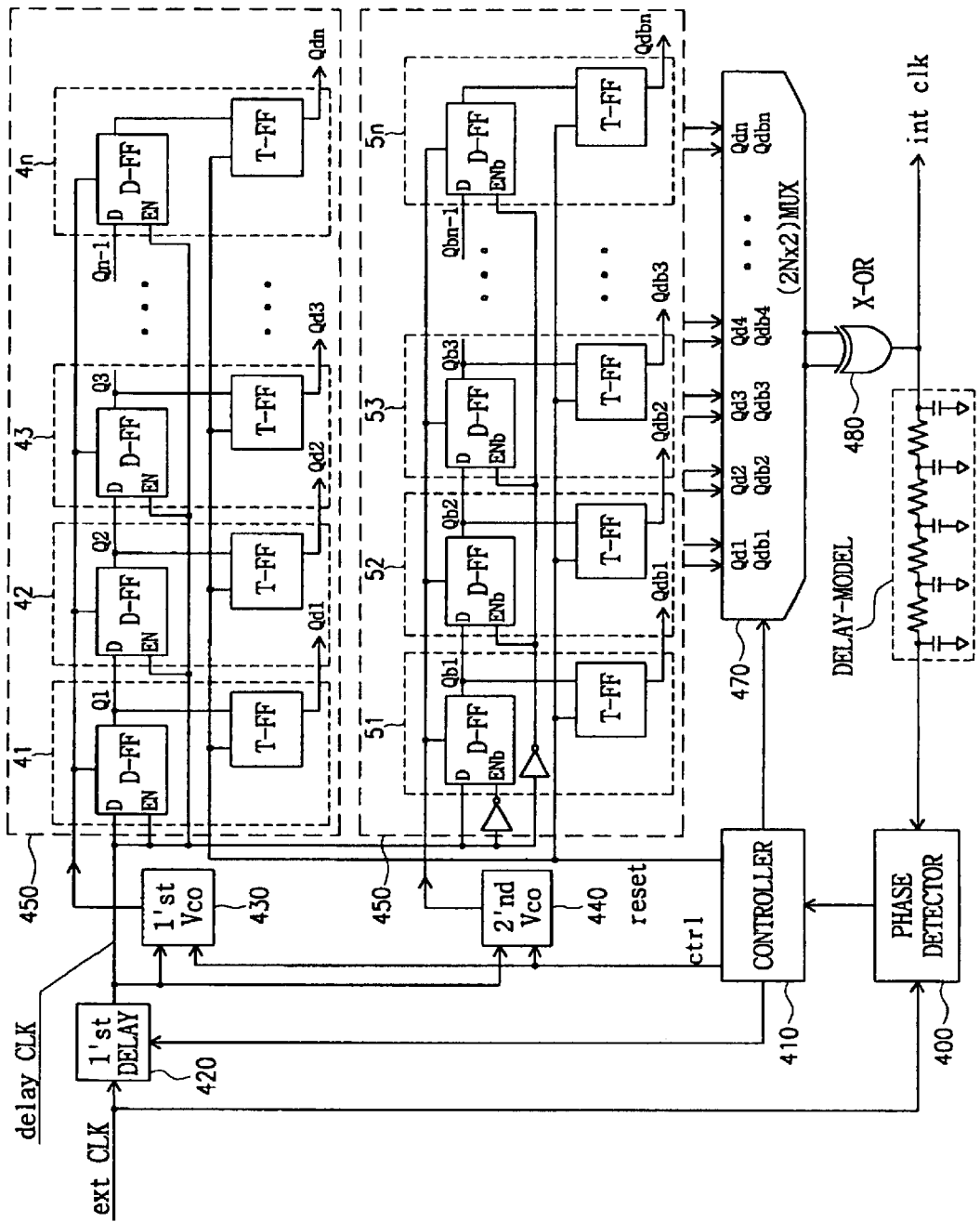
FIG. 4 is a circuit diagram of a delay locked loop circuit in accordance with an embodiment of this invention.

FIG. 4 is a circuit diagram of a delay locked loop circuit in accordance with an embodiment of this invention. The delay locked loop circuit includes: first delay means 420 for receiving an external clock signal ext CLK to generate a clock signal delay CLK delayed for a selected time; first oscillation means 430 for generating a first pulse signal having a constant period in the first logic level interval, i.e., in the logic high level of the delay clock signal delay CLK from the first delay means 420; second oscillation means 440 for generating a second pulse signal having the same period as the first pulse signal in the second logic level interval, i.e., in the low level interval of the delay clock signal delay CLK from the first delay means 420; phase detection means 400 for receiving the external clock signal ext CLK and an internal clock signal int CLK and generating a phase detection signal between two clock signals; second delay means 450 for successively delaying the delay clock signal delay CLK by one period of the first pulse signal of the first oscillation means 430 to generate a first plurality of clock signals Qd1–Qdn in the logic high level interval of the delay clock signal delay CLK, each of the first plurality of clock signals Qd1–Qdn has two times period of the delay clock signal delay CLK; third delay means 460 for successively delaying the delay clock signal delay CLK by one period of the second clock signal of the second oscillation means 440 to generate a second plurality of clock signals Qdb1–Qdbn in the logic low level interval of the delay clock signal delay CLK, each of the second plurality of clock signals Qdb1–Qdbn having two times period of the delay clock signal delay CLK; selection means 470 for selecting a pair of clock signals having the same delay time from the first plurality of clock signals Qd1–Qdn and the second plurality of clock signals Qdb1–Qdbn; logic means 480 for combining the pair of clock signals selected from the selection means 470 to generate the internal clock signal, the internal clock signal having the same period of the external clock signal ext CLK and the internal clock signal being a delayed external clock signal by a selected period of the first pulse signal; and control means for generating control signals for controlling the first delay means 420, the first and second oscillation means 430, 440 and the selection means 470 and a reset signal for resetting the second and third delay means 450 and 460.

Herein, as the first and second oscillation means 430 and 440, voltage controlled oscillators (VCO) are used. The second delay means 450 includes a plurality of digital delay means 41–4n connected in series. The digital delay means 41–4n of the second delay means 450 includes D-flip flops D-FF being activated for a logic high level interval of the delay clock signal delay CLK from the first delay means 420 and for generating clock signals in the logic high level interval of the delay clock signal delay CLK from the first delay means which successively delayed by one period of the first pulse signal from the first oscillation means 430 from the logic high level of the delay clock signal delay CLK from the first delay means 420 and T-flip flops T-FF reset by the reset signal from the control means 410 and for generating the first plurality of clock signals which have two times period of the clock signals from the D-flip flops D-FF and are successively delayed by one period of the first pulse signal from the first oscillation means 430.

The third delay means 460 includes a plurality of digital delay means 51–5n connected in series. The digital delay means 51–5n of the third delay means 460 includes D-flip flops D-FF being activated for a logic low level interval of the delay clock signal delay CLK from the first delay means 420 and for generating clock signals in the logic low level interval of the delay clock signal delay CLK from the first delay means 420 which successively delayed by one period of the second pulse signal from the second oscillation means 440 from the logic low level interval of the delay clock signal delay CLK from the first delay means 420 and T-flip flops T-FF reset by the reset signal from the control means 410 and for generating the second plurality of clock signals which have two times period of the clock signals from the D-flip flops D-FF and are successively delayed by one period of the second pulse signal from the second oscillation means 440.

As the selection means 470, a multiplexer is used and the exclusive OR gate X-OR is used as the logic means 480.

FIG. 5A–FIG. 5L are timing diagrams of the delay locked loop circuit of this invention. The operation of the delay locked loop circuit of FIG. 4 will be described with reference to FIG. 5A–FIG. 5L hereinafter. At the initial state, the output signals Qd1–Qdn and Qdb1–Qdbn of the T-flip flops of the first and second delay means 450 and 460 are reset at logic low state by the reset signal from the control means 410. The external clock signal ext CLK is provided to the first delay means 420 including analog delay devices. The first delay means 420 generates the delay clock signal delay CLK as shown in FIG. 5A.

At this time, analog delay device of the first delay means 420 is narrow in a range of delay addition and subtraction and has a delay corresponding one period of the first or second pulse signal from the voltage controlled oscillator in the first or second oscillation means 430 or 440 which has a maximum frequency. Therefore, in the delay clock signal delay CLK of logic high level, the first oscillation means 430 and the second delay means 450 are activated. On the other hand, the second oscillation means 440 and the third delay means 460 are activated in the delay clock signal delay CLK of logic low level.

That is, the logic high level interval t1 of the delay clock signal DCLK from the first delay means 420 as shown in FIG. 5A, the first oscillation means 430 is activation by the delay clock signal delay CLK from the first delay means 420 and generates a first pulse signal having the constant period T in logic high level interval of the delay clock signal delay CLK as shown in FIG. 5B.

The second delay means 450 is activated by the delay clock signal delay CLK from the first delay means 420 and the D-flip flops D-FF respectively generate clock signals Q1–Qn which successively delayed by one period of the first pulse signal from the first oscillation means 430 from the delay clock signal delay CLK of the logic high level interval as shown in FIG. 5D–FIG. 5F. The output signals Q1–Qn from the second delay means 450 are transited at logic low level when the delay clock signal becomes at logic low level.

Then, the clock signals from the D-flip flops are respectively provided to clock terminals of the T-flip flops T-FF. The T-flip flops T-FF generate the first plurality of clock signals which have two times period of the output signals Q1–Qn of D flip-flops D-FF and are successively delayed by one period of the first pulse signal from the delay clock signal DCLK of logic high level as shown in FIG. 5J.

On the other hand, in low level interval t2 of the delay clock signal delay CLK as shown in FIG. 5A, the second oscillation means 440 is activated by the delay clock signal delay CLK of logic low level as shown in FIG. 5A. The second oscillation means 440 generates the second pulse signal having a constant period of T in logic low level of the delay clock signal delay CLK. According to this, the third delay means 460 is activated by the delay clock signal delay CLK of logic low level and then D-flip flops D-FF generate clock signals Qb1–Qbn which are successively by one period of the second pulse signal from the delay clock signal delay CLK of logic low level in logic low level interval t2 of the delay clock signal delay CLK. The clock signals Qb1–Qbn of D-flip flops D-FF are transited at logic low level as shown in FIG. E, when the delay clock signal delay CLK from the first delay means 420 becomes at logic high level.

The clock signals Qb1–Qbn of the D-flop flops are provided to clock terminals of the T-flip flops and the T-flip flops T-FF generate the second plurality of clock signals which have two times period of output signals Qb1–Qbn of D-flip flops D-FF and are successively delayed by one period of the second pulse signal from the delay clock signal delay CLK of logic low level interval as shown in FIG. 5K.

The clock signals Q1–Qn of the D-flip flops D-FF in the second delay means 450 as show in FIG. 5D–FIG. 5F and the clock signals Gb1–Qbn of the D-f lip flops D-FF in the third delay means 460 as shown in FIGS. 5G–5I have the same period as the delay clock signal delay CLK as shown in FIG. 5A and are successively delayed by one period of the first or second pulse signal from the first or second oscillation means 430 or 440 from the delay clock signal delay CLK of logic high level or logic low level. The duty cycles of clock signals Q1 to Qn or Qb1 to Qbn from the D-flip flops of the second or third delay means 450 or 460 become more and more smaller.

The first and second plurality of clock signals Qd1–Qdn and Qdb1–Qdbn from the T-flip flops of the second and third delay means 450 and 460 have two times period of the delay clock signal DCLK and are successively delayed by one period of the first or second pulse signal. The first and second plurality of clock signals Qd1–Qdn and Qdb1–Qdbn have duty cycles of 50%.

The selection means 470 selects a pair of clock signals having the same delay time from the first and second plurality of clock signals of the T-flip flops T-FF in the second and third delay means 450 and 460 by the control signal from the control means 410. Suppose that the pair of clock signals Qd2 and Qdb2 through the digital delay device 42 and 52 of the second and third delay means 450 and 460 are selected from the first and second plurality of clock signals from the second and third delay means 450 and 460 as shown in FIG. 5J and FIG. 5K in accordance with the control signal from the control means 410. The exclusive OR gate X-OR of the logic means 480 receives the pair of clock signals Qd2 and Qdb2 and generates the internal clock signal int CLK as shown in FIG. 5L which has the same period as the external clock signal ext CLK and is delayed by selected period of the first or second pulse signal from the delay clock signal delay CLK, for example by one period.

According to the present invention, the delay locked loop circuit generates a plurality of internal clock signals having different phases with each other through the digital delay devices and selects any one of internal clock signals having a selected phase by the multiplexer in the selection means. Therefore, this invention can fast detects the phase of the internal clock signal which should be adjusted to the external clock signal and can adjust the operation range by the clock signal from the oscillation means, thereby broadening the operation range with the superior performance of the prior delay locked loop circuit. Besides, the correction of the large duty error can be obtained by the multiplexer's adjustment.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A delay locked loop circuit, comprising:
   first delay means for receiving an external clock signal to generate a delay clock signal delayed for a selected time;
   first oscillation means for generating a first pulse signal having a constant period in the first logic level interval of the delay clock signal from the first delay means;
   second oscillation means for generating a second pulse signal having the same period as the first pulse signal in the second logic level interval of the delay clock signal from the first delay means;
   phase detection means for receiving the external clock signal and an internal clock signal and generating a phase detection signal between two clock signals;
   second delay means for successively delaying the delay clock signal by one period of the first pulse signal of the first oscillation means to generate a first plurality of clock signals in the first logic level interval of the delay clock signal, each of the first plurality of clock signals having two times period of the delay clock signal;
   third delay means for successively delaying the delay clock signal by one period of the second pulse signal of the second oscillation means to generate a second plurality of clock signals in the second level interval of the delay clock signal, each of the second plurality of clock signals having two times period of the delay clock signal;
   selection means for selecting a pair of clock signals having the same delay time from the first plurality of clock signals and the second plurality of clock signals;
   logic means for combining the pair of clock signals selected from the selection means to generate the internal clock signal, the internal clock signal having the same period of the external clock signal and the internal clock signal being a delayed clock signal of the external clock signal by a selected period of the first pulse signal; and
   control means for generating control signals for controlling the first delay means, the first and second oscillation means and the selection means and a reset signal for resetting the first and second delay means in accordance with the phase detection signal from the detection means.

2. The delay locked loop circuit as claimed in claim 1, wherein the first logic level interval is logic high level interval of the delay clock signal and the second logic level interval is logic low level interval of the delay clock signal.

3. The delay locked loop circuit as claimed in claim 1, wherein the second delay means includes:
   D-flip flops being activated for a first logic level interval of the delay clock signal from the first delay means and for generating clock signals in the first logic level interval of the delay clock signal from the first delay means which successively delayed by one period of the first pulse signal from the first oscillation means from the first logic level of the delay clock signal from the first delay means; and
   T-flip flops reset by the reset signal from the control means and for generating the first plurality of clock signals which have two times period of the clock signals from the D-flip flops and are successively delayed by one period of the first pulse signal from the first oscillation means.

4. The delay locked loop circuit as claimed in claim 1, wherein the third delay means includes:
   D-flip flops D-FF being activated for the second logic level interval of the delay clock signal from the first delay means and for generating clock signals in the second logic level interval of the delay clock signal from the first delay means which successively delayed by one period of the second pulse signal from the second oscillation means from the second logic level of the delay clock signal from the first delay means; and T-flip flops reset by the reset signal from the control means and for generating the second plurality of clock signals which have two times period of the clock signals from the D-flip flops and are successively delayed by one period of the second pulse signal from the second oscillation means.

5. The delay locked loop circuit as claimed in claim 1, wherein the selection means is comprised of a multiplexer.

6. The delay locked loop circuit as claimed in claim 1, wherein the logic means is comprised of an exclusive OR gate.

7. The delay locked loop circuit as claimed in claim 1, wherein the first and second oscillation means are comprised of voltage controlled oscillators.

* * * * *